US010415999B2

(12) United States Patent
Aichriedler et al.

(10) Patent No.: US 10,415,999 B2
(45) Date of Patent: *Sep. 17, 2019

(54) ROTATION ANGLE SENSOR SYSTEM AND METHOD

(71) Applicant: Infineon Technologies AG, Neubiberg (DE)

(72) Inventors: Leo Aichriedler, Puch (AT); Peter Slama, Klagenfurt (AT)

(73) Assignee: Infineon Technologies AG (DE)

( * ) Notice: Subject to any disclaimer, the term of this patent is extended or adjusted under 35 U.S.C. 154(b) by 74 days.

This patent is subject to a terminal disclaimer.

(21) Appl. No.: 15/649,913

(22) Filed: Jul. 14, 2017

(65) Prior Publication Data

US 2017/0314966 A1    Nov. 2, 2017

Related U.S. Application Data

(63) Continuation of application No. 14/996,735, filed on Jan. 15, 2016, now Pat. No. 9,739,640.

(51) Int. Cl.
*G01B 7/14* (2006.01)
*G01B 7/30* (2006.01)
(Continued)

(52) U.S. Cl.
CPC ............. *G01D 5/165* (2013.01); *G01D 5/142* (2013.01); *G01D 5/145* (2013.01); *G01R 15/20* (2013.01); *G01R 15/202* (2013.01); *G01R 21/08* (2013.01); *G01R 33/06* (2013.01); *G01R 33/07* (2013.01)

(58) Field of Classification Search
CPC ...... G01D 5/142; G01R 15/20; G01R 15/202; G01R 21/08; G01R 33/06; G01R 33/07; G01R 33/077
(Continued)

(56) References Cited

U.S. PATENT DOCUMENTS

| 6,060,969 A | 5/2000 | Hufgard et al. |
| 2007/0180890 A1 | 8/2007 | Steinich |

(Continued)

FOREIGN PATENT DOCUMENTS

| CN | 2901846 Y | 5/2007 |
| CN | 103175550 A | 6/2013 |

(Continued)

*Primary Examiner* — Huy Q Phan
*Assistant Examiner* — Raul J Rios Russo
(74) *Attorney, Agent, or Firm* — Design IP

(57) ABSTRACT

Rotational angle sensor systems and methods are provided for detecting an angular position of a movable structure. The movable structure may be configured to rotate about an axis of rotation between a first rotational position and a second rotational position. A magnet may have a magnetic field pattern with a magnetic field orientation and an angle sensor may be configured to detect the magnetic field pattern and generate one or more signals, based on the magnetic field orientation, corresponding to a rotational position of the movable structure. Additionally, a first one of the magnet and the angle sensor is configured to rotate about the axis of rotation relative to a second one of the magnet and the angle sensor that is rotationally fixed such that the magnetic field orientation changes relative to the angle sensor as the movable structure rotates about the axis of rotation.

26 Claims, 5 Drawing Sheets

(51) Int. Cl.
  *G01R 33/06*  (2006.01)
  *H01L 43/08*  (2006.01)
  *G01D 5/165*  (2006.01)
  *G01D 5/14*  (2006.01)
  *G01R 15/20*  (2006.01)
  *G01R 21/08*  (2006.01)
  *G01R 33/07*  (2006.01)

(58) Field of Classification Search
  USPC ....... 324/51, 55, 200, 207.11, 207.13, 207.2, 324/251
  See application file for complete search history.

(56) References Cited

U.S. PATENT DOCUMENTS

| | | | | |
|---|---|---|---|---|
| 2008/0036452 | A1* | 2/2008 | Hirayama | H04M 1/0233 324/207.2 |
| 2009/0206827 | A1 | 8/2009 | Aimuta et al. | |
| 2011/0175601 | A1 | 7/2011 | Bogos et al. | |
| 2011/0187351 | A1* | 8/2011 | Hunger | G01D 5/145 324/207.2 |
| 2012/0299586 | A1 | 11/2012 | Martin et al. | |
| 2013/0218517 | A1* | 8/2013 | Ausserlechner | G01B 7/30 702/151 |
| 2014/0197820 | A1* | 7/2014 | Ritter | G01B 7/14 324/207.13 |
| 2015/0008907 | A1* | 1/2015 | Janisch | G01D 5/145 324/207.25 |
| 2017/0045377 | A1* | 2/2017 | Vallmajo I Ribas | G01D 5/145 |

FOREIGN PATENT DOCUMENTS

| | | |
|---|---|---|
| CN | 203705158 U | 7/2014 |
| CN | 105008643 A | 10/2015 |
| DE | 10024230 A1 | 11/2001 |
| WO | 2009/079685 A1 | 7/2009 |

* cited by examiner

ROTATION ANGLE SENSOR SYSTEM AND METHOD

CROSS-REFERENCE TO RELATED APPLICATIONS

This application is a continuation of U.S. patent application Ser. No. 14/996,735 filed Jan. 15, 2016, which is incorporated by reference as if fully set forth.

FIELD OF INVENTION

This disclosure generally relates to systems for detecting a position of a movable structure, and in particular, to detecting a position of a movable structure that has an axis of rotation.

BACKGROUND

Door opening systems may be employed to detect whether a door is open or closed via a contact switch. However, the information a contact switch can provide is limited to a binary result (e.g., whether a door is opened or closed). Therefore, applications which use this detection scheme are also limited.

SUMMARY

Rotational angle sensor systems and methods are provided for detecting an angular position of a movable structure. A rotational angle sensor system may include a movable structure, a magnet, and an angle sensor. The movable structure may be configured to at least partially enclose an opening and is configured to rotate about an axis of rotation between a first rotational position and a second rotational position such that an extent of enclosure of the opening by the movable structure changes. The a magnet may have a magnetic field pattern which has a magnetic field orientation. The angle sensor may be configured to detect the magnetic field pattern and generate at least one signal based on the magnetic field orientation such that the at least one signal represents a rotational position of the movable structure. Furthermore, a first one of the magnet and the angle sensor may be configured to rotate about the axis of rotation relative to a second one of the magnet and the angle sensor that is rotationally fixed such that the magnetic field orientation changes relative to the angle sensor as the movable structure rotates about the axis of rotation.

In another example, a rotational angle sensing method includes rotating a movable structure about an axis of rotation, where the movable structure is configured to at least partially enclose an opening and rotates about the axis of rotation such that an extent of enclosure of the opening by the movable structure changes with rotation; detecting, by an angle sensor, a magnetic field pattern of a magnet, where the magnetic field pattern has a magnetic field orientation; and generating, by the angle sensor, at least one signal based on the magnetic field orientation, where the at least one signal represents a rotational position of the movable structure. In addition, a first one of the magnet and the angle sensor may be configured to rotate about the axis of rotation relative to a second one of the magnet and the angle sensor such that the magnetic field orientation changes relative to the angle sensor as the movable structure rotates about the axis of rotation.

BRIEF DESCRIPTION OF THE DRAWINGS

A more detailed understanding may be had from the following description, given by way of example in conjunction with the accompanying drawings wherein.

DETAILED DESCRIPTION

In general, this disclosure is related to a sensor system configured to detect or sense a position of a movable structure (e.g., a door, a window, or the like) that rotates on or around an axis of rotation (e.g., a hinge, movable joint or the like). The movable structure may be any structure that is configured to at least partially enclose an opening and is configured to rotate about the axis of rotation between a first rotational position and a second rotational position such that an extent of enclosure of the opening by the movable structure changes. For example, the first rotational position may be a closed position such that the opening is fully enclosed or at least partially enclosed by the movable structure and the second rotational position ay be an open position such that the opening is at least partially open (i.e., at least partially enclosed) or completely open (i.e., not enclosed at all). Additionally, in some examples, the moveable structure may be positioned at a first angle at the first rotational position and may be positioned at a second angle at the second rotational position. The sensor system may be configured to detect and/or determine the first and second angles.

While not limited thereto, in automotive body door applications, it may be important to determine whether a door is open or closed. For upcoming advanced applications, information regarding the exact door open angle as well as the angular speed and acceleration may be needed.

The sensor system disclosed herein may employ a rotational angle sensor to determine, not only whether a door is opened or closed, but also discrete, finite positions therebetween. Therefore, a door opening angle may be determined by the rotational angle sensor from the rotational angle of the door. In addition, an angular speed and/or acceleration of a rotation of the movable structure may be determined by detecting and/or calculating the rate of change between the finite positions detected by the rotational angular sensor as a door is opened or closed.

Figure 1:
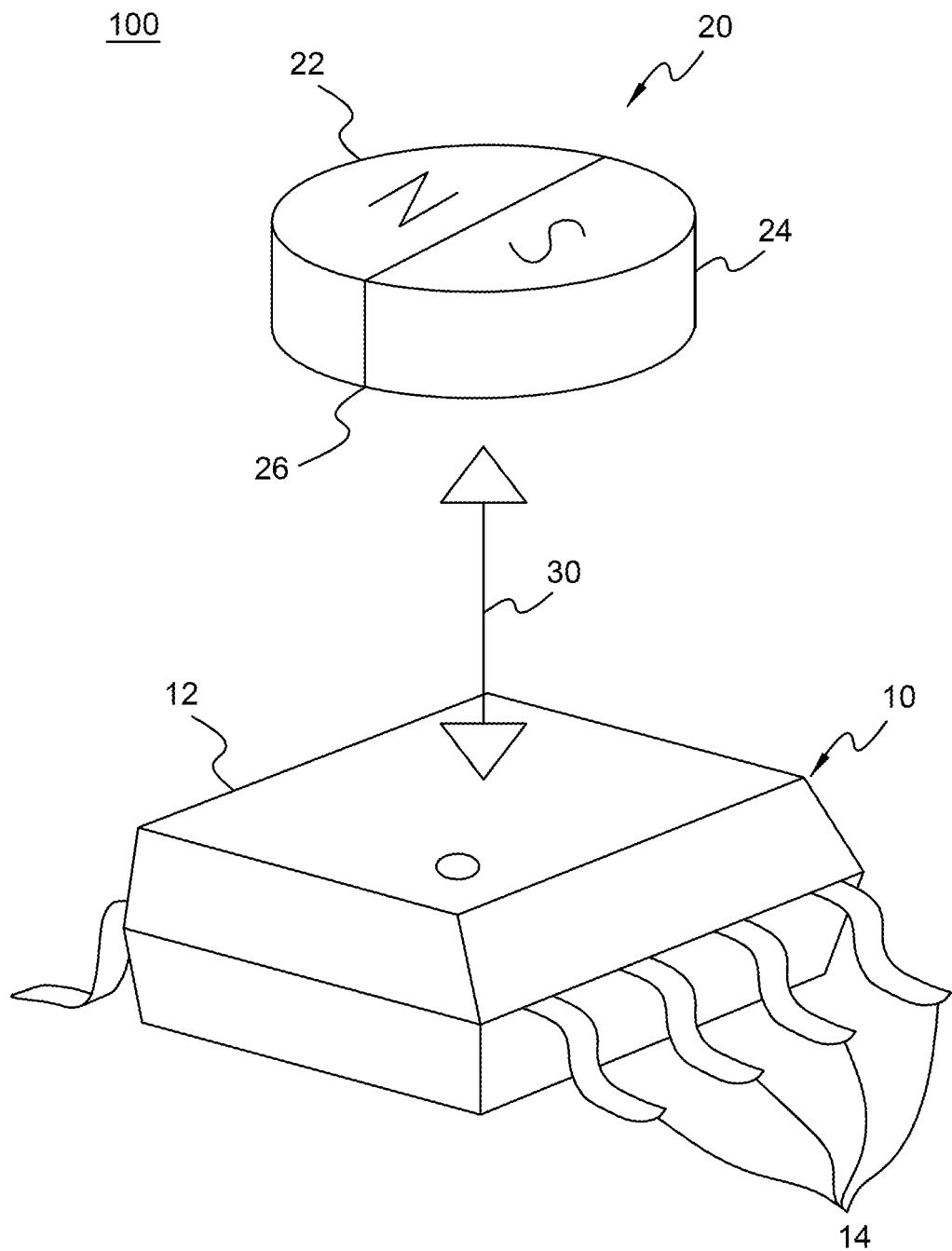
FIG. 1 illustrates an exemplary embodiment of a rotational angle sensor system.

FIG. 1 illustrates an exemplary embodiment of a rotational angle sensor system 100. The rotational angle sensor system 100 includes an angle sensor 10 disposed spaced apart from, but in proximity to, a magnet 20 which produces an external magnetic field having a magnetic field pattern for detection by the angle sensor 10. The angle sensor 10 and the magnet 20 may be generally referred to herein as sensor components. In addition, it will be appreciated that the location of the angle sensor 10 and magnet 20 may be interchangeable with each other in any of the exemplary embodiments disclosed herein.

The angle sensor 10 is arranged in axial alignment with the magnet 20 such that one of the two (i.e., either the angle sensor 10 or the magnet 20) is a fixed component that remains in a fixed position such that the fixed component does not rotate (e.g., rotationally fixed) and the other of the two (i.e., either the magnet 20 or the angle sensor 10) is a rotating component that is arranged on a rotating member (not shown) that has an axis of rotation 30. Accordingly, both the angle sensor 10 and the magnet 20 may be centered on the axis of rotation 30 of the rotating member, and one of the two (i.e., either the angle sensor 10 or the magnet 20) is configured to rotate on the axis of rotation 30 and the other is arranged in a rotationally fixed position (i.e., does not rotate) such that one rotates on the axis of rotation 30 relative to the other.

Alternatively, the angle sensor 10 and the magnet 20 may be substantially centered on the axis of rotation 30 of the rotating member, taking into account an acceptable degree of manufacturing tolerances and error, e.g., 5% of the diameter of the rotating member. In another example, the angle sensor 10 and the magnet 20 may be concentric or substantially concentric about the axis or rotation 30. In a further example, the angle sensor 10 may be arranged such that a sensor area of the angle sensor 10 is centered, substantially centered, concentric or substantially concentric with the axis of rotation 30. The sensor area of the angle sensor is an area in which the sensor elements (e.g., Giant Magnetoresistive (GMR) elements, Anisotropic Magneto-Resistive (AMR) elements, Tunnel Magnetoresistance (TMR) elements, Hall sensor elements, etc.) that detect the magnetic field are arranged. In another example, the angle sensor 10 and/or the magnet 20 may be aligned with the axis of rotation 30 such that the axis of rotation 30 intersects with at least a portion of the angle sensor 10 and/or at least a portion of the magnet 20. It will be appreciated that any of the forgoing arrangements, and combinations thereof, may be applied to any of the exemplary embodiments disclosed herein.

The angle sensor 10 may be a sensor integrated circuit (IC) which includes a package body 12 and multiple pins 14. The pins 14 may be configured to receive or output information, and may be configured as, e.g., control pins (e.g., to receive a clock signal) or input/output (I/O pins). The angle sensor 10 may also include one or more sensor elements, a digital signal processor (DSP) and memory disposed within the package body 12. The sensor elements may measure one or more characteristics the magnetic field (e.g., an amount of magnetic field flux density, a field strength, a field angle, a field direction or a field orientation, etc.) corresponding to detecting and/or measuring the magnetic field pattern of the magnet 20. From sensing one or more field characteristics, the sensor elements may be adapted to generate analog detection signals corresponding to the angular orientation of the magnet 20 and output the analog detection signals to, for example, the DSP or an I/O pin.

Upon receiving the analog detection signals, the DSP may calculate position information representing the angular orientation of the magnetic field, which may be the angular position and/or direction of rotation of the magnet, rotating member and/or of the moveable structure. The angle sensor 10 may include a memory and the DSP may output the position information to the memory for being stored therein. In addition or alternatively, the DSP may further output the position information to an external device or system via one or more of pins 14, or the position information may be read from the memory.

The magnet 20 may be a permanent magnet that includes opposite poles, e.g., a north pole 22 and a south pole 24, and may be bilaterally divided into the north pole 22 and south pole 24 such that the north pole 22 comprises a first bilateral portion (e.g., a first half) of the magnet 20 and the south pole 24 comprises a second bilateral portion (e.g., a second half) of the magnet 20. A boundary 26 of the north pole 22 and south pole 24 may be aligned with the axis of rotation 30. While not limited thereto, the magnet 20 may have a round shape and/or may be a magnet pill.

In addition, since the angle orientation of the magnetic field also corresponds to an angle orientation of the magnet that produces the magnet field, the information or signals (e.g., analog detection signals) provided by the angle sensor 10 also represent an angle orientation of the magnet relative to the angle sensor 10. That is, as the magnet rotates relative to the sensor, so does the magnetic field it produces. Accordingly, as will become readily apparent throughout the disclosure, a change in rotation of the magnetic field orientation relative to the angle sensor may be proportional to a change in a rotational position of the movable structure.

The magnet 20 has a magnetic field, which is a vector field having a field direction and field strength. A convenient way of describing a magnetic field is the concept of magnetic field lines which form a magnetic field pattern. The magnetic field visible to the angle sensor 10 may, therefore, be described as a magnetic field pattern visible to the sensor. The magnetic field pattern could be a projection of the magnetic field onto a sensitivity plane of the angle sensor 10, as one example. The magnetic field pattern may be symmetrical to one or more symmetry axis. For example, the magnet 20 may have a mirror symmetrical behavior to the boundary 26 separating the north and the south pole.

The rotating member may be, for example, a hinge assembly or other movable joint coupled to a movable structure and rotates as the movable structure rotates on, around or about an axis. The hinge assembly may have rotating part (e.g., a rotating cap, etc.), for example, for having the angle sensor 10 or magnet 20 arranged thereon. For example, the rotating member may be a door hinge coupled to a door. Alternatively, the rotating member may be a bracket (e.g., arm bracket, mechanical arm or the like) that rotates or swivels as the movable structure rotates around an axis.

According to an example of a door and hinge system, the door may be mounted to an axis of rotation at the door hinge, and as the door rotates between an open and closed position, the door rotates around the axis of rotation of the door hinge. Accordingly, as a rotating part of the door hinge rotates about the axis of rotation along with the movement of the door, the rotating component of the rotational angle sensor system 100 also rotates on the axis of rotation relative to the fixed component of the rotational angle sensor system 100. This creates a rotation in the orientation of the magnetic field, which can be detected and measured by the angle sensor 10. Thus, the angle sensor 10 may be configured to internally calculate the orientation and/or direction of the magnetic field, and, consequently, may be configured to calculate an angle or degree of rotation of the rotating member and/or the movable structure (e.g., an absolute angle of a door). Additionally or alternatively, the angle sensor 10 may output analog signals derived from the sensed magnetic field, which are further processed (e.g., via an angle, direction of rotation, speed and/or acceleration calculation) in an external control unit and/or external processing unit.

In addition, an angular speed and/or acceleration of a rotation of the door may be determined by detecting and/or calculating the rate of change between positions detected by the rotational angular sensor 10 as a door is opened or closed. It will be appreciated that the above foregoing concepts may also be applied to other applications, e.g., a system utilizing a rotating arm bracket.

According to exemplary embodiments disclosed herein, the rotational angle sensor 10 may be a GMR sensor. The GMR sensor may be configured to measure or sense magnetic field direction and/or magnetic field orientation of an applied external magnetic field. The GMR sensors may directly detect a magnetic field pattern and may be sensitive to small changes in magnetic field direction and/or orientation of the magnetic field pattern. This allows for accurate measurement of position or displacement rotational systems. Exposure to an external magnetic field changes the resistance of GMR structures disposed within the GMR sensor based on the orientation and/or direction of the external magnetic field. Accordingly, the GMR structures can be used to sense the external magnetic field direction and/or orientation and a direction of change. Furthermore, a rotational angle sensor, such as an angle GMR sensor, may be configured to detect many measurement points per revolution (i.e., per 360°). For example, the GMR sensor may be configured to measure 4096 points or positions per revolution. Therefore, the GMR sensor may be capable of detecting a magnetic field direction and/or orientation at a high resolution and calculate an angular orientation (e.g., an angle) of the magnetic field pattern with high accuracy.

The GMR sensor may be configured such that information, signals and/or sensed characteristics related to the measured orientation of the magnetic field pattern may be generated as analog signals and output from one or more sensor elements to a signal processor (e.g., a DSP) coupled to the sensor elements such that the angle orientation of the magnetic field is calculated by the signal processor. The signal processor may also measure and calculate angular speed and/or acceleration of a rotation of the magnetic field pattern based on a change in rate in orientation of the magnetic field. The GMR sensor may be provided as an integrated circuit (IC) for integrated magnetic field sensing and the DSP may be provided in a same package as the GMR sensor elements to form a GMR sensor IC. Information related to the value of the angle may be further output by the DSP to an external device or system (e.g., an electronic control unit (ECU), a microcontroller, a processor or the like). Data communications from the sensor IC providing the calculated angle may be accomplished by outputting the information to a data communication line via a data interface of the sensor IC.

It will be appreciated that the rotational angle sensor 10 is not limited to GMR sensors, and that it may be any absolute angle sensor that is capable of detecting a magnetic field pattern and measuring an orientation, direction and/or strength of the magnetic field pattern such that position information (e.g., angle, speed and/or acceleration information) can be calculated from the raw measurement data (e.g., analog signals), either internally or externally. For example, the rotational angle sensor 10 may be one of a GMR, AMR, TMR or Hall sensor. xMR sensors (e.g., GMR, AMR, TMR, etc.) are sensitive to the magnetic field direction/orientation, and may be configured to detect changes therein for outputting analog signals and/or calculating position information (e.g., angle, speed and/or acceleration information) from the analog signals generated from the measuring of the magnetic field. Hall sensors are sensitive to an amount of magnetic field flux density/field strength, and may be configured to detect changes therein for outputting analog signals and/or calculating position information (e.g., angle, speed and/or acceleration information) from the analog signals generated from the measuring of the magnetic field. The rotational angle sensor 10 may be configured to continuously measure the state of the magnetic field pattern, and the orientation thereof, and the measurements may be based solely on the momentary magnetic field without receiving information of past behavior of the magnetic field pattern.

It will be appreciated that the orientation of the magnetic field pattern may be determined either explicitly, as in the case of xMR technology, by measuring the orientation directly, or implicitly, as in the case of Hall sensors, by measuring the strength of the magnetic field pattern at multiple locations on the sensor or on different vector field plates of the sensor and using the measurements to determine the orientation.

Figure 2:
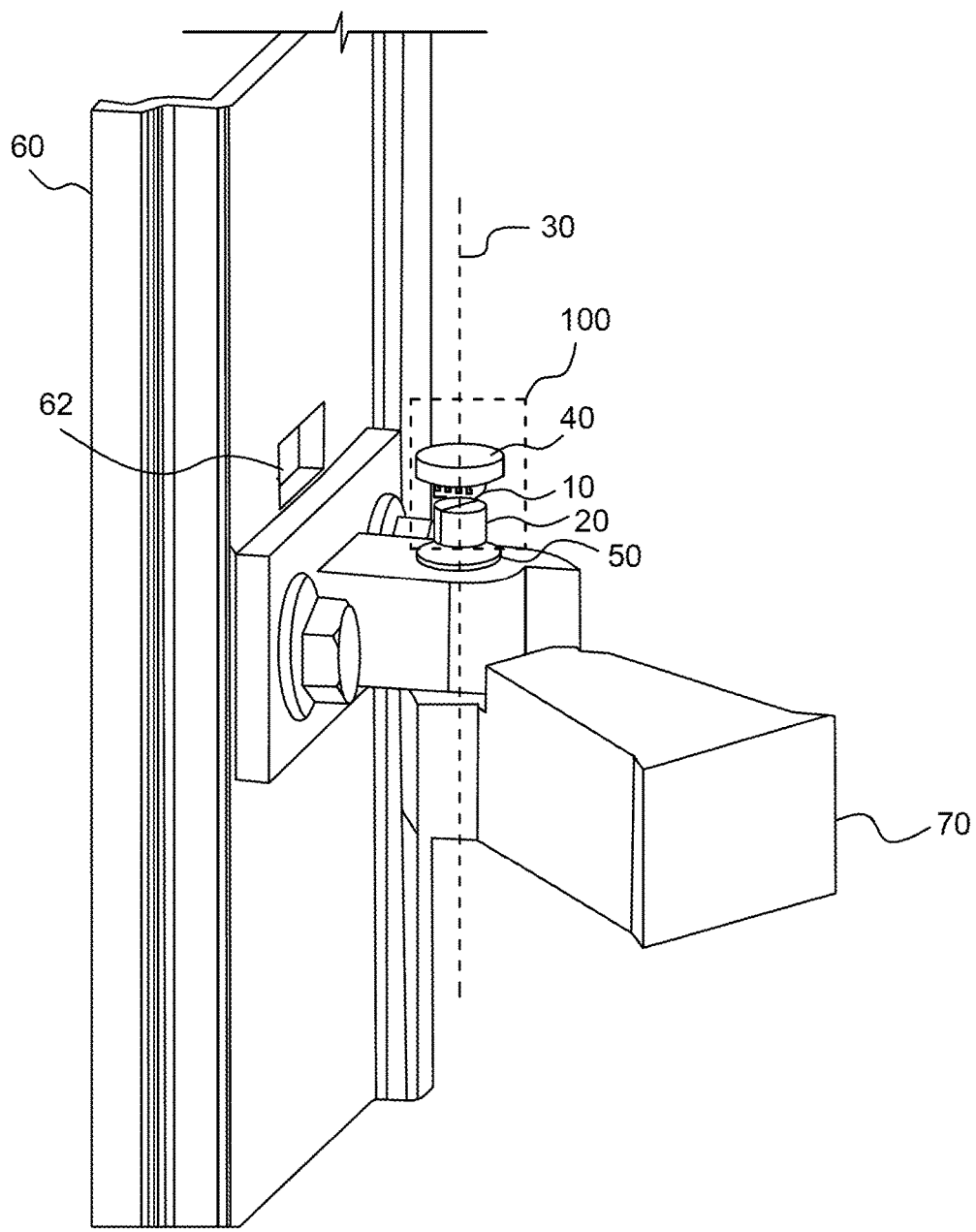
FIG. 2 illustrates an exemplary embodiment of an implementation of the rotational angle sensor system shown in FIG. 1.

FIG. 2 illustrates an exemplary embodiment of an implementation of the rotational angle sensor system 100 shown in FIG. 1. FIG. 2 shows a door angle sensor system 200 which includes rotational angle sensor system 100. The angle sensor 10 may be disposed on a fixed structure, such as a printed circuit board (PCB) 40 or other substrate structure that mechanically supports and electrically connects electronic components using conductive tracks, pads and other features etched from conductive sheets laminated onto a non-conductive substrate. The magnet 20 may be disposed on a rotating member 50 of a door system. It will be further appreciated that the placement of the angle sensor 10 and the magnet 20 can be swapped without departing from the concepts disclosed herein. For example, the angle sensor 10 may be disposed on a fixed structure and the magnet 20 may be disposed on a rotating member (e.g., see FIG. 3A) of the door system. Thus, one of the angle sensor 10 or magnet 20 rotates on the axis of rotation 30 relative to the other. In other words, the rotating component of the rotational angle sensor system 100 rotates on the axis of rotation 30 relative to the fixed component of the rotational angle sensor system 100.

The rotating member 50 may be a rotating part of a door hinge assembly which has an axis of rotation that coincides with the axis of rotation 30, and rotates on, around or about the axis of rotation 30. Alternatively, the rotating member 50 may be a support structure (e.g., one or more brackets, an arm bracket, a housing, a carrier or the like) connected to the door module 60 or the hinge assembly and which supports the magnet 20 thereon. The door system may be a vehicle door system, which includes the rotating member 50 (e.g., a door hinge or other movable joint) that connects or links a door module 60 to a vehicle body portion 70 or to an extension thereof. The rotating member 50 may be configured to enable the door module 60 to rotate about the axis of rotation 30 between open and closed positions. Additionally or alternatively, the rotating member 50 may be connected to the door module 60 such that the rotating member 50 rotates as the door module 60 changes position. The door module 60 may be mounted to the axis of rotation 30 (e.g., at the hinge), and the door system may be a passive (i.e., manual) or an automated system for changing the position of the door.

The PCB 40 may be extended and connected to the door module 60 or to the vehicle body portion 70 or fixed via a support structure (e.g., one or more brackets, an arm bracket, a housing, a carrier or the like) to the vehicle body portion 70 such that the angle sensor 10 remains in a fixed position and spaced apart from the magnet 20.

The support structures may be referred to as a sensor bracket, sensor support member, sensor housing, sensor carrier, magnet bracket, magnet support member, magnet housing or magnet carrier depending on its application and whether it supports angle sensor 10 or magnet 20.

The door module 60 may also include an opening 62 defined in the door module 60 to allow a connecting member (not shown) or the PCB 40 to extend from the angle sensor 10 to electrical components (e.g., an ECU, microcontroller and/or processor) disposed inside the door module 60 or at another location of the vehicle. For example, the connecting member may be a wire harness, cable or lead frame which provides an electrical connection from the PCB 40 to one or more electrical components.

When a moveable structure, such as the door module 60, rotates around the axis of rotation 30 between open and closed positions, it causes the rotating member 50 (e.g., part of the door hinge) to also rotate such that the change in orientation of the rotating member 50 as it rotates corresponds, and is directly proportional, to a change in the door opening angle. Furthermore, as the rotating member 50 rotates and its orientation changes, one of the angle sensor 10 and magnet 20 rotates relative to the other. Thus, a change in rotation of the magnetic field orientation relative to the angle sensor may be proportional to a change in a rotational position of the movable structure such that the angle sensor 10 detects and measures this change in rotational position of the movable structure that is caused by the angular movement of the movable structure. For example, depending on the resolution of the angle sensor 10, a 5 degree change in a rotational position of the movable structure may cause a proportional change (e.g., 2.5 degrees, 5 degrees, 10 degrees, etc.) in the rotational position of the magnetic field orientation of the magnetic field pattern such that the rotational position of the movable structure can be determined based on the measured magnetic field pattern. A person of ordinary skill will appreciate that in case the proportional change is systematically larger or smaller than the change in the rotational position, a gear (not shown) may be required.

In the example shown in FIG. 2, the angle sensor system 100 is applied to the center of door rotation (e.g., the axis of rotation 30). Here, the magnet 20 is disposed on the rotating member 50 and rotates on the axis of rotation 30 relative to the angle sensor 10. As the magnet 20 rotates, the magnetic field it provides rotates and changes its orientation or direction relative to the angle sensor 20. The angle sensor 20 may detect the change in orientation or direction of the magnetic field, perform measurements, and calculate an angle value that correspond to the angle of the door, which may further correspond to the door being fully open, fully closed or any angle therebetween. The angle sensor 20 may continuously monitor the orientation of the magnetic field and, from the door opening angle, the exact door position may be determined by the angle sensor 10. The angle sensor 20 may also be configured to calculate the speed and/or acceleration of rotation of the door by detecting and measuring the rate of change in the orientation of the magnetic field. Accordingly, by employing a rotational angular sensor, such as a GMR sensor, an angular accuracy and resolution of a door position may be improved.

Figure 3A:
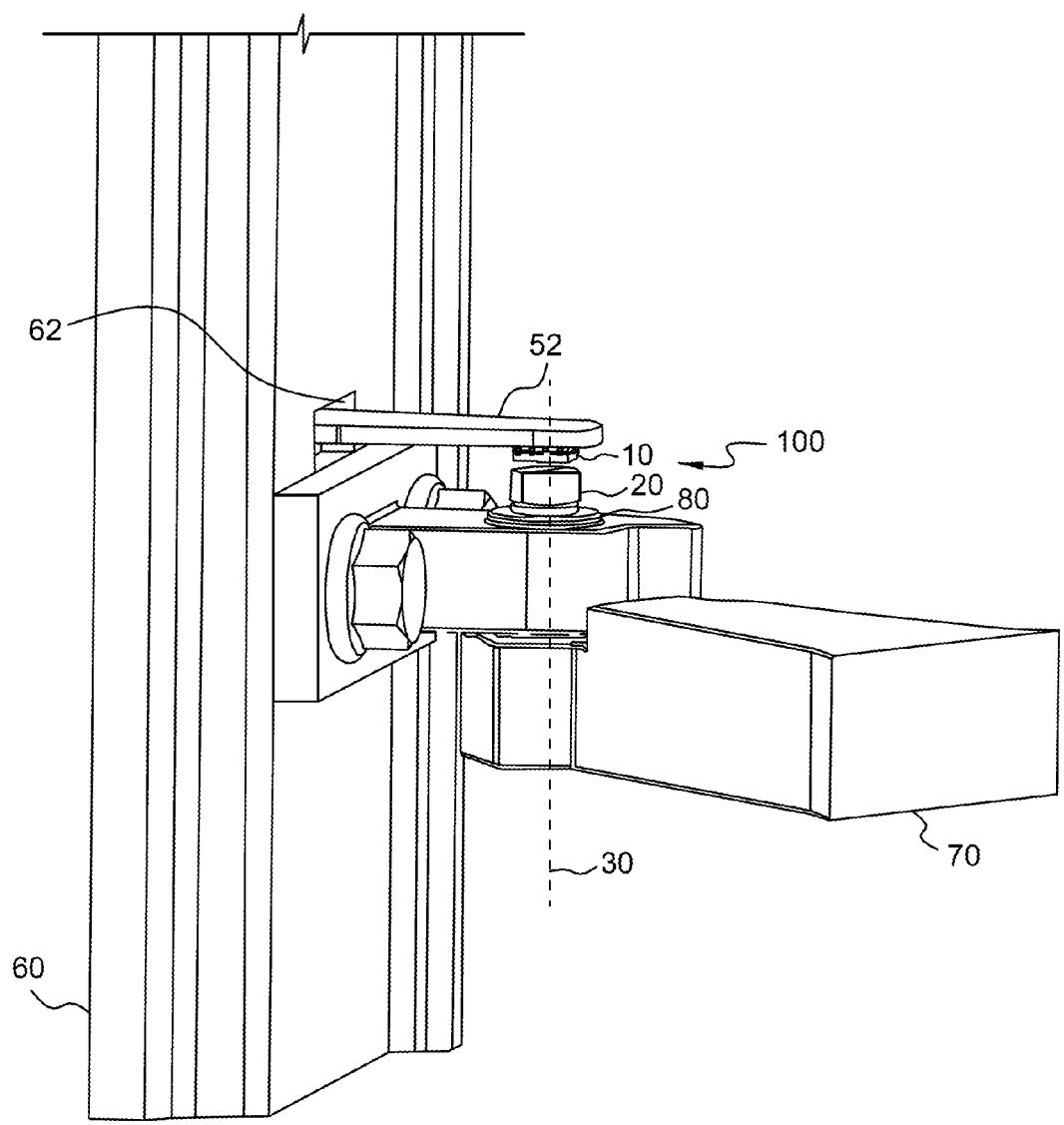
FIGS. 3A-3C illustrate another exemplary embodiment of an implementation of the rotational angle sensor system shown in FIG. 1.
Figure 3B:
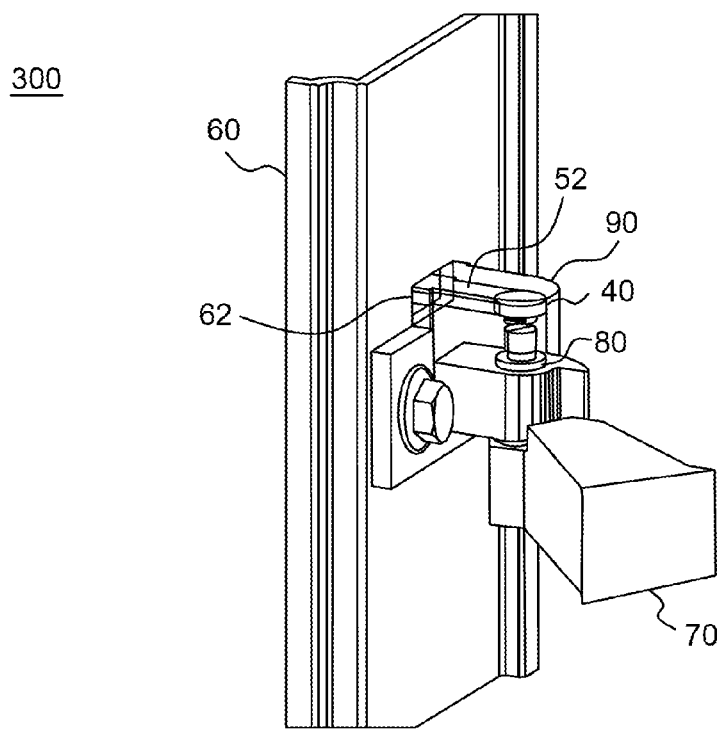
Figure 3C:
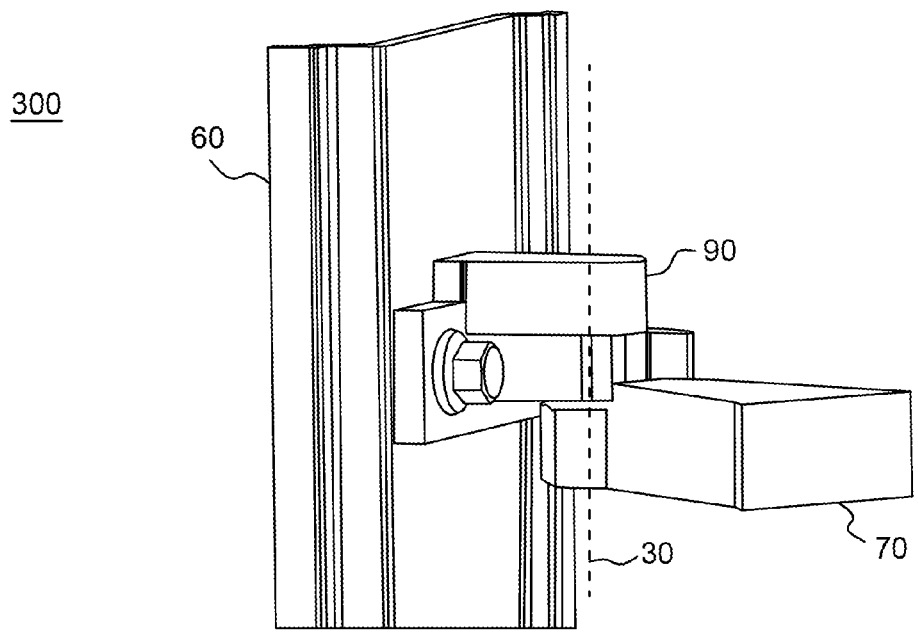

FIGS. 3A-3C illustrate an exemplary embodiment of an implementation of the rotational angle sensor system 100 shown in FIG. 1. FIGS. 3A and 3B illustrate a door angle sensor system 300 that includes the angle sensor system 100 and additionally includes a rotating member 52, a fixed member 80 and a housing 90 (shown in FIG. 3C, only). Here, the magnet 20 is disposed on a fixed member 80 (e.g., a bolt) that may be connected to the vehicle body portion 70. The fixed member 80 may be a fixed component of a hinge assembly (e.g., a bolt, anchor or a pin). Accordingly, the magnet 20 is the fixed component of the rotational angle sensor system 100 and does not rotate. On the other hand, the angle sensor 10 is disposed on the rotating member 52 and rotates on the axis of rotation 30 relative to the magnet 20. Thus, the angle sensor is the rotating component of the rotational angle sensor system 100.

The housing 90 (shown in FIG. 3C) may be connected to the door module 60 and may provide protection to the other components of the angle sensor system 100. The housing 90 may rotate as the door module 60 rotates. It will be appreciated that the housing 90 may also be applied to the example illustrated in FIG. 2.

The angle sensor 10 is disposed on the PCB 40 that is coupled to the rotating member 52. The rotating member 52 may be a connecting member coupled to the door module 60 at the opening 62. Alternatively, the rotating member 52 may be a connecting member that connects to and extends from the PCB 40, through opening 62, to a portion of the door module 60 inside a cavity of the door module 60.

Further, the rotating member 52 and/or door module 60 may be configured such that the rotating member 52 rotates or pivots on, around or about the axis of rotation 30. Thus, as the door module 60 rotates between open and closed positions around the axis of rotation 30, the rotating member 52 also rotates relative to the angle of the door module 60. The rotating member 52 may be configured to maintain the angle sensor 10 in a position centered on the axis of rotation 30 while enabling the angle sensor 10 to rotate relative to the angle of the door module 60. It will also be understood that the rotating member 52 may be configured to maintain the angle sensor 10 in a position substantially centered, concentric, substantially concentric or aligned with the axis of rotation 30 while enabling the angle sensor 10 to rotate relative to the angle of the door module 60. The rotating member 52 may be any support structure (e.g., one or more brackets, an arm bracket, pivot arm, or the like) that supports the angle sensor, or in some examples the magnet 20, and enables the supported component to rotate on the axis of rotation 30. The support structure may be referred to as a sensor bracket, sensor support member, magnet bracket or magnet support member depending on its application and whether is supports angle sensor 10 or magnet 20.

The PCB 40 and/or the rotating member 52 may be configured to realize a connection (e.g., an electrical connection) from the angle sensor 10 to an ECU, microcontroller and/or processor of a vehicle, which may reside inside the cavity of the door module 60 or at another location within the vehicle. The rotating member 52 may be any support structure that supports the angle sensor 10 and enables rotation centered on the axis of rotation 30, spaced apart from the magnet 20. For example, the rotating member 52 may be a bracket (e.g., arm bracket) that supports a PCB extension, wire harness, cable or other connector capable of carrying electrical signals from the angle sensor 10 and/or PCB 40 through the opening 62. Similar to the door angle sensor system 200 shown in FIG. 2, if the door module 60 moves, one of the angle sensor 10 and magnet 20 rotates relative to the other.

Figure 4:
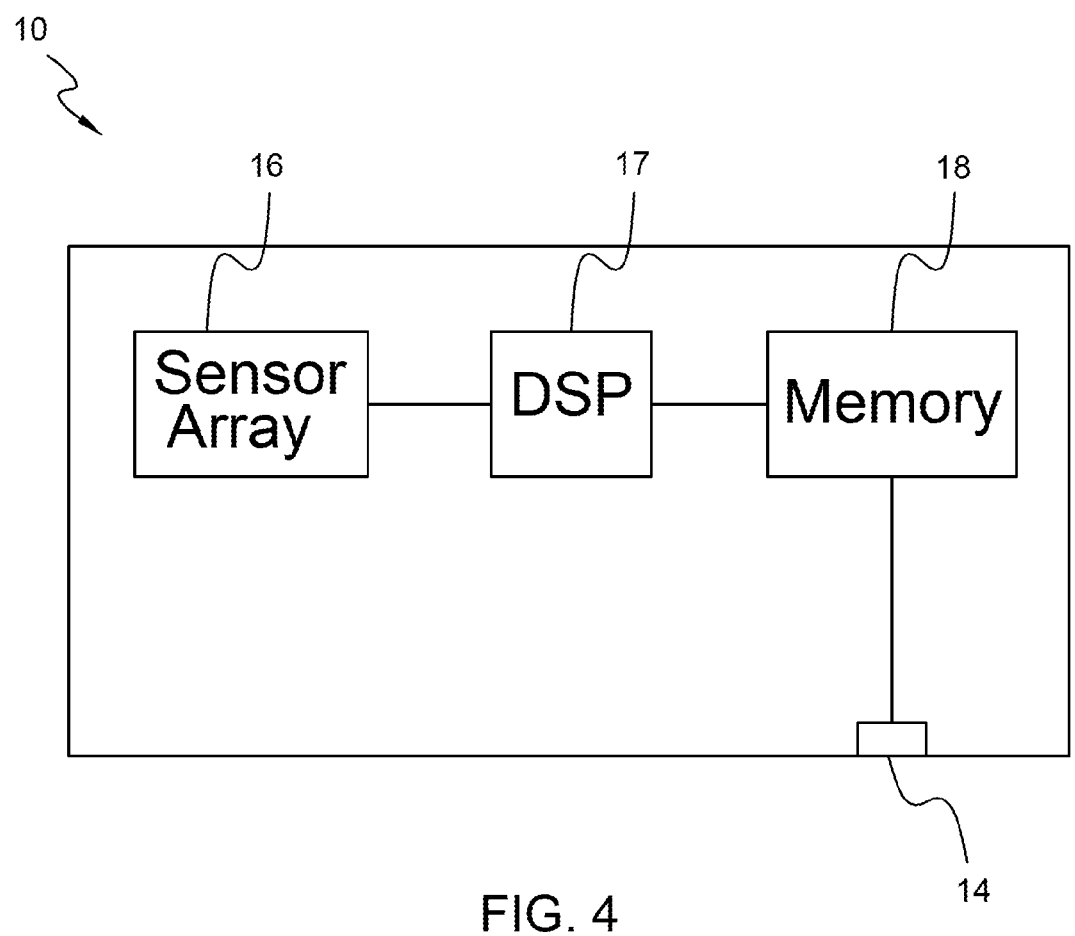
FIG. 4 illustrates an exemplary embodiment of an angle sensor implemented in an exemplary rotational angle sensor system.

FIG. 4 illustrates an exemplary embodiment of an angle sensor 10 implemented in an exemplary rotational angle sensor system 100. The angle sensor shown in FIG. 4 may include a sensor array 16, a DSP 17 and a memory 18 connected to a pin 14. However, it will be appreciated that the sensor array 16 and/or the DSP 17 may be connected to the pin 14 as well or in the alternative. It will also be appreciated that the sensor array 16 may be formed at one or more locations within the angle sensor 10, and is not limited to a single location.

The rotational angle sensor system 100 may be applied to other rotating members (e.g., hinges) in automotive body applications. For example, the rotational angle sensor system 100 may be applied to trunk lid position detection, cabriolet folding top position detection, sunroof position/opening angle detection, etc., as long as the angle sensor 10 and magnet 20 perform a relative rotational movement to each other. As described above, the angle sensor 10 and magnet 20 may be placed at the rotational axis of the center of rotation in these applications.

An exemplary embodiment of a method for employing the rotational angle sensor system 100 is disclosed and may use any of the operations disclosed herein for calculating position information, e.g., an angle, position and/or rate of change, disclosed herein. For example, an exemplary method may include rotating the rotating member (e.g., rotating member 50 or 52), either from movement of the movable structure itself or from a control mechanism, such as a motor, which controls the rotation of the rotating member to cause movement of the movable structure. The method may further include measuring, by the angle sensor 10, a magnetic field produced by the magnet 20, where the angle sensor and magnet are centered on the axis of rotation and the magnetic field has an orientation that corresponds to a degree of rotation of the rotating member. From the measuring, the example method may include determining, by the angle sensor 10, the orientation of the magnetic field based on the measuring of the magnetic field, calculating, by the angle sensor 10, position information related to a position of the movable structure based on the determined orientation of the magnetic field, and outputting, by the angle senor 10, the position information via an interface to an external device.

As in the other exemplary embodiments, one of the magnet and the angle sensor is configured to rotate on the axis of rotation relative to the other one of the magnet and angle sensor such that the orientation of the magnetic field changes relative to the angle sensor as the rotating member rotates. The method may also include detecting, by the angle sensor 10, a change in the degree of rotation of the rotating member based on a change in the orientation of the magnetic field, calculating, by the angle sensor 10, the degree of rotation of the rotating member based on the orientation of the magnetic field, and outputting, by the angle sensor, the degree of rotation to an external device. The method may also include calculating, by the angle sensor 10, a rate of change in the orientation of the magnetic field, and calculate a rate of change in position of the movable structure therefrom. One or more processors may perform and/or assist in performing one or more operations of the disclosed exemplary method.

The rotational angle sensor system 100 may also be applied to other door and window positioning systems that employ a rotational member having an axis of rotation that may be used to detect an opening angle or position of a movable structure. For example, the rotational angle sensor system 100 may be applied to any door system (e.g., household door, car door, trunk lid, gate, garage door, etc.), white goods (e.g., a refrigerator door), top hung and bottom hung windows, window blinds or shades, etc., that employs a rotating member for changing position. The rotational angle sensor system 100 may be applied to a rotary mechanism, such as a rotary spindle, shaft or belt system, that is controlled by a motor and is used to control a position of a movable structure, such as those movable structures mentioned herein. The rotational angle sensor system 100 may be applied to detect the position of a door, lid, window, etc., an opening angle thereof and opening/closing speed thereof.

In addition, the rotational angle sensor system 100 may be applied in a feedback control system that monitors and/or controls the opening angle of any of these applications. For example, the angle sensor 10 may output angle information to an external microcontroller, microprocessor or processor that performs a position monitoring and control. The angle position output from the angle sensor 10 may be used to control a motor for controlling the position and/or the rate of change in position of the movable structure.

The external microcontroller, microprocessor or processor may, for example, notify a user of an opening angle, which may include a fully open position, fully closed position or any angle therebetween, through some indicator or output device (e.g., lighting system, display, audio system, warning system, etc.). The external microcontroller, microprocessor or processor may perform a threshold test to compare a measured angle with a threshold to perform monitoring and control.

The external microcontroller, microprocessor or processor may be provided in conjunction with a mechanism that is configured to open/close windows and doors, which may or may not be an automated system. For example, the external microcontroller, microprocessor or processor may use the angle information output from the angle sensor 10 to control the position or angle of the movable structure (e.g., the door, window, etc.). In such applications, the external microcontroller, microprocessor or processor may also be used to control and/or limit an opening or closing speed of the moveable structure by performing a threshold test or other monitoring. Accordingly, the external microcontroller, microprocessor or processor may control the range of motion, position and/or speed of the movable structure by increasing, decreasing or limiting the opening angle of the movable structure via the mechanism based on the angle information received from the rotational angle sensor system 100.

Furthermore, the rotational angle sensor system 100 may be applied in security systems to detect an unauthorized use of a door or window. In other instances, the rotational angle sensor system 100 may be applied to heating and cooling systems to aid in controlling a temperature by monitoring and/or controlling a position of a door, window, window blind or the like.

Spatially relative terms such as "top", "bottom", "front", "back", "under", "below", "lower", "over", "upper" and the like, may be used herein and are for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A rotational angle sensor system comprising:
    a movable structure configured to at least partially enclose an opening and is configured to rotate about an axis of rotation between a first rotational position and a second rotational position such that an extent of enclosure of the opening by the movable structure changes;
    a magnet having a magnetic field pattern which has a magnetic field orientation; and
    an angle sensor configured to detect the magnetic field pattern and generate at least one signal based on the magnetic field orientation, wherein the at least one signal represents a rotational position of the movable structure,
    wherein a first one of the magnet and the angle sensor is configured to rotate about the axis of rotation relative to a second one of the magnet and the angle sensor that is rotationally fixed such that the magnetic field orientation changes relative to the angle sensor as the movable structure rotates about the axis of rotation.

2. The rotational angle sensor system of claim 1, wherein a change in rotation of the magnetic field orientation relative to the angle sensor is proportional to a change in the rotational position of the movable structure.

3. The rotational angle sensor system of claim 1, wherein a field angle of the magnetic field pattern relative to the angle sensor corresponds to the rotational position of the movable structure.

4. The rotational angle sensor system of claim 1, wherein the rotational position of the movable structure is an angular position of the movable structure.

5. The rotational angle sensor system of claim 1, wherein the angle sensor includes at least one processor configured to calculate the rotational position of the movable structure based on the at least one signal.

6. The rotational angle sensor system of claim 1, wherein the angle sensor is a hall sensor configured to measure a field strength of the magnetic field pattern and generate the at least one signal based on the measured field strength.

7. The rotational angle sensor system of claim 1, wherein the angle sensor is an xMR sensor configured to measure the magnetic field orientation and generate the at least one signal based on the measured magnetic field orientation.

8. The rotational angle sensor system of claim 1, wherein the angle sensor includes at least one processor configured to calculate rotational position information related to the rotational position of the movable structure based on the at least one signal, and
    wherein the rotational position information includes at least one of an angular position of the movable structure, an angular speed of the movable structure or an angular acceleration of the movable structure.

9. The rotational angle sensor system of claim 1, further comprising:
    a rotating member configured to rotate about the axis of rotation based on movement of the movable structure,
    wherein the first one of the magnet and the angle sensor is arranged on the rotating member and is configured to rotate about the axis of rotation as the rotating member rotates.

10. The rotational angle sensor system of claim 9, wherein the second one of the magnet and the angle sensor is arranged on a fixed member such that the second one of the magnet and the angle sensor is in proximity to the first one of the magnet and the angle sensor and is rotationally fixed.

11. The rotational angle sensor system of claim 9, wherein the rotating member is coupled to the movable structure at a first end and is coupled to the first one of the magnet and the angle sensor at a second end, and the magnetic field orientation relative to the angle sensor changes as the rotating member rotates about the axis of rotation.

12. The rotational angle sensor system of claim 9, wherein the rotating member is coupled to a rotating part of a hinge assembly coupled to the movable structure.

13. The rotational angle sensor system of claim 1, wherein the movable structure is mounted to the axis of rotation.

14. A rotational angle sensing method comprising:
    rotating a movable structure about an axis of rotation, wherein the movable structure is configured to at least partially enclose an opening and rotates about the axis of rotation such that an extent of enclosure of the opening by the movable structure changes with rotation;
    detecting, by an angle sensor, a magnetic field pattern of a magnet, wherein the magnetic field pattern has a magnetic field orientation; and
    generating, by the angle sensor, at least one signal based on the magnetic field orientation, wherein the at least one signal represents a rotational position of the movable structure,
    wherein a first one of the magnet and the angle sensor is configured to rotate about the axis of rotation relative to a second one of the magnet and the angle sensor such that the magnetic field orientation changes relative to the angle sensor as the movable structure rotates about the axis of rotation.

15. The rotational angle sensing method of claim 14, wherein a change in rotation of the magnetic field orientation relative to the angle sensor is proportional to a change in the rotational position of the movable structure.

16. The rotational angle sensing method of claim 14, wherein a field angle of the magnetic field pattern relative to the angle sensor corresponds to the rotational position of the movable structure.

17. The rotational angle sensing method of claim 14, wherein the rotational position of the movable structure is an angular position of the movable structure.

18. The rotational angle sensing method of claim 14, further comprising:
calculating, by the angle sensor, the rotational position of the movable structure based on the at least one signal.

19. The rotational angle sensing method of claim 14, wherein the angle sensor is a hall sensor configured to measure a field strength of the magnetic field pattern and generate the at least one signal based on the measured field strength.

20. The rotational angle sensing method of claim 14, wherein the angle sensor is an xMR sensor configured to measure the magnetic field orientation and generate the at least one signal based on the measured magnetic field orientation.

21. The rotational angle sensing method of claim 14, further comprising:
calculating, by the angle sensor, rotational position information related to the rotational position of the movable structure based on the at least one signal,
wherein the rotational position information includes at least one of an angular position of the movable structure, an angular speed of the movable structure or an angular acceleration of the movable structure.

22. The rotational angle sensing method of claim 14, further comprising:
rotating a rotating member about the axis of rotation based on movement of the movable structure, wherein the first one of the magnet and the angle sensor is arranged on the rotating member and is configured to rotate about the axis of rotation as the rotating member rotates.

23. The rotational angle sensing method of claim 22, wherein the second one of the magnet and the angle sensor is arranged on a fixed member such that the second one of the magnet and the angle sensor is in proximity to the first one of the magnet and the angle sensor and is rotationally fixed.

24. The rotational angle sensing method of claim 22, wherein the rotating member is coupled to the movable structure at a first end and is coupled to the first one of the magnet and the angle sensor at a second end, and the magnetic field orientation relative to the angle sensor changes as the rotating member rotates about the axis of rotation.

25. The rotational angle sensing method of claim 22, wherein the rotating member is coupled to a rotating part of a hinge assembly coupled to the movable structure.

26. The rotational angle sensing method of claim 14, wherein the movable structure is mounted to the axis of rotation.

* * * * *